United States Patent
Xiong

(10) Patent No.: US 11,641,179 B2
(45) Date of Patent: May 2, 2023

(54) POWER AMPLIFIER AND VEHICLE AUDIO SYSTEM

(71) Applicant: Autochips Wuhan Co., Ltd., Wuhan (CN)

(72) Inventor: Xianfeng Xiong, Wuhan (CN)

(73) Assignee: AUTOCHIPS WUHAN CO., LTD., Wuhan (CN)

( * ) Notice: Subject to any disclaimer, the term of this patent is extended or adjusted under 35 U.S.C. 154(b) by 0 days.

(21) Appl. No.: 17/343,717

(22) Filed: Jun. 9, 2021

(65) Prior Publication Data

US 2021/0391830 A1   Dec. 16, 2021

(30) Foreign Application Priority Data

Jun. 10, 2020 (CN) .......................... 202010525870.6

(51) Int. Cl.
  *H03F 1/30* (2006.01)
  *H03F 3/21* (2006.01)
  *H04R 1/02* (2006.01)

(52) U.S. Cl.
  CPC ............. *H03F 1/30* (2013.01); *H03F 3/211* (2013.01); *H04R 1/025* (2013.01); *H03F 2200/03* (2013.01); *H03F 2200/447* (2013.01); *H04R 2499/13* (2013.01)

(58) Field of Classification Search
  CPC ........ H03F 1/30; H03F 3/211; H03F 2200/03; H03F 2200/447; H04R 1/025; H04R 2499/13
  See application file for complete search history.

(56) References Cited

U.S. PATENT DOCUMENTS

| 5,365,188 A * | 11/1994 | Botti ..................... H03F 3/3081 330/84 |
| 5,654,668 A * | 8/1997 | Botti ........................ H03F 3/72 330/146 |
| 7,230,482 B2* | 6/2007 | Chelli ................... H03F 1/0277 330/69 |
| 2011/0123040 A1 | 5/2011 | Hissink et al. |
| 2015/0035596 A1 | 2/2015 | Nussbaum et al. |

(Continued)

FOREIGN PATENT DOCUMENTS

| CN | 104143963 B | 5/2017 |
| CN | 111211749 A | 5/2020 |

OTHER PUBLICATIONS

Notice of examination in Taiwan, China, Application No. 110121102, dated Dec. 23, 2021 (8 pages).

*Primary Examiner* — Jason R Kurr

(57) ABSTRACT

A power amplifier includes: at least two first bridge type amplifying circuits and at least two second bridge type amplifying circuits; the negative pole of the first load of each first bridge type amplifying circuit is respectively coupled to the positive stage of the second load of each second bridge type amplifying circuits through a gating circuit. When both a first input signal input into one of the at least two first bridge type amplifying circuits and a second input signal input into one of the at least two second bridge type amplifying circuits are less than a preset threshold, the gating circuit is turned on, so that the one of the at least two first bridge type amplifying circuits and the one of the at least two second bridge type amplifying circuits can share load current by the gating circuit.

20 Claims, 5 Drawing Sheets

(56) References Cited

U.S. PATENT DOCUMENTS

| | | |
|---|---|---|
| 2015/0296293 A1 | 10/2015 | Hogan et al. |
| 2016/0276993 A1* | 9/2016 | Tsurumi .............. H03G 3/3031 |
| 2017/0085236 A1 | 3/2017 | Quilter et al. |
| 2021/0297045 A1* | 9/2021 | Yamauchi ........... H03F 3/45475 |

* cited by examiner

POWER AMPLIFIER AND VEHICLE AUDIO SYSTEM

CROSS REFERENCE TO RELATED APPLICATIONS

The present application claims priority to the Chinese patent application No. 202010525870.6, entitled "POWER AMPLIFIER, CONTROL METHOD THEREOF, AND VEHICLE AUDIO SYSTEM" and filed to the National Intellectual Property Administration of China on Jun. 10, 2020, the entire contents of which are hereby incorporated by reference in their entireties.

TECHNICAL FIELD

The present application relates to a field of integrated circuit technology, in particular to a power amplifier, a control method of the power amplifier, and a vehicle audio system.

BACKGROUND

Class AB power amplifiers are widely used in entertainment systems because of their good sound quality and higher efficiency than Class A. The theoretical maximum efficiency of the class AB power amplifier is only 75%. Long-term playback can easily cause the chip to overheat and cause the risk of chip performance degradation or even burnout. Therefore, how to improve efficiency has become an important consideration in power amplifier design.

Generally, the following solutions can be used to reduce power consumption. The first solution is to use a class H power amplifier to reduce power consumption, and the second solution is to design a class D power amplifier to reduce power consumption. However, for the first solution, the class H power amplifier adjusts the input power supply to reduce power consumption, but need to adjust the power supply to control the chip, and the cost is relatively high. For the second solution, the class D power amplifier adopts a high-speed clock signal, which is easy to cause interference at the audio frequency terminal, the EMI problem is difficult to solve, and the class D power amplifier needs to be equipped with inductance, which is relatively expensive.

BRIEF DESCRIPTION OF THE DRAWINGS

Implementations are described by way of example only with reference to the attached figures. The drawings here is used to further explain the present disclosure, and as a part of the application. The schematic embodiments of the present disclosure and the description are used to explain the present disclosure, and not as an improper limitation of the present disclosure.

DETAILED DESCRIPTION

The following describes the solutions of the embodiments of the present application in detail with reference to the drawings in the specification.

In the following description, for the purpose of illustration rather than limitation, specific details such as a specific system structure, interface, technology, etc. are proposed for a thorough understanding of the present application.

The terms "system" and "network" in present application are often used interchangeably. The term "and/or" in present application is only an association relationship describing associated objects, which means that there can be three kinds of relationships, for example, A and/or B can mean: A alone exists, A and B exist at the same time, B alone exists these three situations. In addition, the character "I" in present application generally indicates that the associated objects before and after are in an "or" relationship. In addition, "many" in present application means two or more than two.

The term "comprising" means "including, but not necessarily limited to"; it specifically indicates open-ended inclusion or membership in a so-described combination, group, series and the like. It should be noted that references to "an" or "one" embodiment in this disclosure are not necessarily to the same embodiment, and such references mean at least one. Unless otherwise defined, all technical and scientific terms used herein have the same meaning as a skilled person in the art would understand. The terminology used in the description of the present disclosure is for the purpose of describing particular embodiments and is not intended to limit the disclosure.

Figure 1:
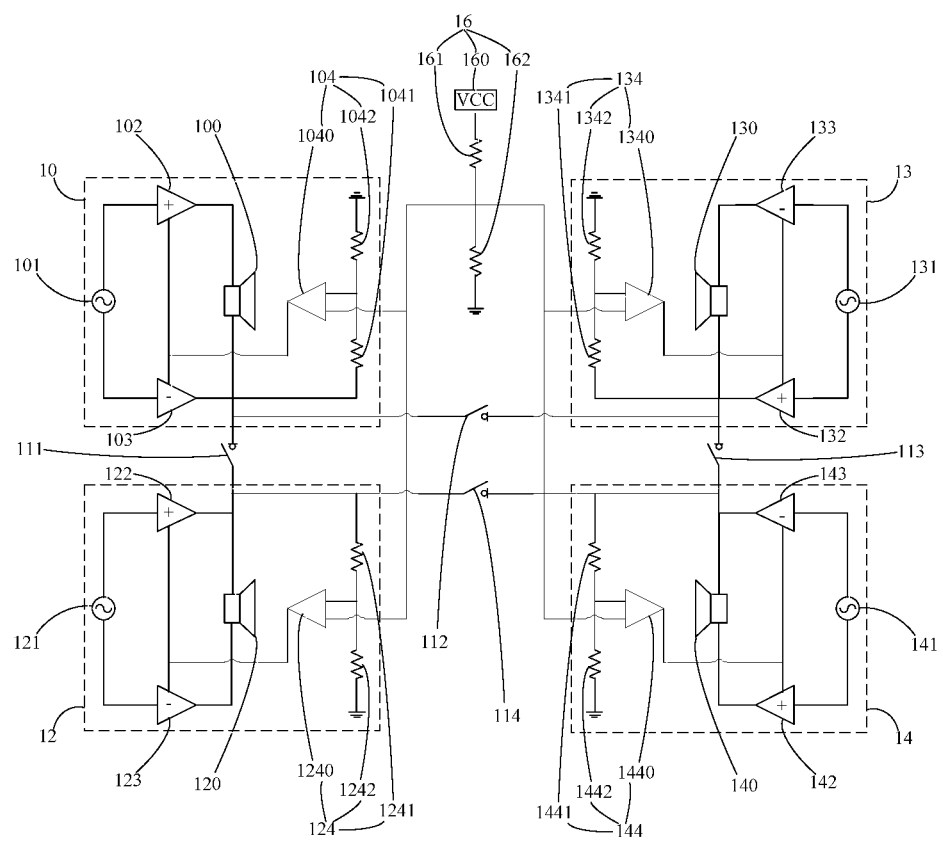
FIG. 1 is a schematic view of an embodiment of a power amplifier.

The present application provides a power amplifier, as shown in FIG. 1, which is a schematic view of an embodiment of the power amplifier of the present application. In one embodiment, the power amplifier includes: at least two first bridge type amplifying circuits 10 and at least two second bridge type amplifying circuits 12; the negative pole of the first load 100 of each first bridge type amplifying circuit 10 is respectively coupled to the positive pole of the second load 120 of each second bridge type amplifying circuit 12 through a gating circuit 111; when both the input signal input from the first signal input terminal 101 of the first bridge type amplifying circuit 10 and the input signal input from the second signal input terminal 121 of the second bridge type amplifying circuit 12 is less than the preset threshold, the gating circuit 111 is turned on, and the load current IL of the first bridge type amplifying circuit 10 is transmitted to the second load 120 of the second bridge type amplifying circuit 12 by the gating circuit 111, or the load current IIL of the second bridge type amplifying circuit 12 is transmitted to the first load 100 of the first bridge type amplifying circuit 10 by the gating circuit 111, so that the first bridge type amplifying circuit 10 and the second bridge type amplifying circuit 12 can share load current. When the first bridge type amplifying circuit 10 and the second bridge type amplifying circuit 12 have different load current, the load current will be transmitted from the one which has more current to the other one which has less current. The negative pole of the first load 100 of each first bridge type amplifying circuit 10 is not coupled to the positive pole of the first load 100 of other first bridge type amplifying circuit 10. The negative pole of the second load 120 of each second bridge type amplifying circuit 12 is not coupled to the positive pole of the second load 120 of other second bridge type amplifying circuit 12.

In one embodiment, when the input signal input from the first signal input terminal 101 of the first bridge type amplifying circuit 10 is less than the preset threshold and the input signal input from the second signal input terminal 121 of the second bridge type amplifying circuit 12 is also less than the preset threshold, the gating circuit 111 is turned on, and the load current IL of the first bridge type amplifying circuit 10 is transmitted to the second load 120 of the second bridge type amplifying circuit 12 by the gating circuit 111 and also the load current IIL of the second bridge type amplifying circuit 12 is transmitted to the first load 100 of the first bridge type amplifying circuit 10 by the gating circuit 111, thus the current can be shared between the first bridge type amplifying circuit 10 and the second bridge type amplifying circuit 12, which improve the efficiency of the bridge type amplifying circuit, so that the power amplifier can save power consumption significantly, and the efficiency of the class AB power amplifiers is improved.

Further, the first bridge type amplifying circuit 10 includes a first differential amplifier 102, a second differential amplifier 103, and a first common mode feedback circuit 104. The positive input terminal of the first differential amplifier 102 and the positive input terminal of the second differential amplifier 103 are respectively connected to the first signal input terminal 101. A first load 100 is connected between the output terminal of the first differential amplifier 102 and the output terminal of the second differential amplifier 103. The input terminal of the first common mode feedback circuit 104 is configured for inputting common mode level. The output terminal of the first common mode feedback circuit 104 is used as the input terminal of the common mode circuit of the first differential amplifier 102 and the second differential amplifier 103, to stabilize the output stage common mode levels of the first differential amplifier 102 and the second differential amplifier 103. The second bridge type amplifying circuit 12 includes a third differential amplifier 122, a fourth differential amplifier 123, and a second common mode feedback circuit 124. The positive input terminal of the third differential amplifier 122 and the positive input terminal of the fourth differential amplifier 123 are respectively connected to the second signal input terminal 121. The second load 120 is connected between the output terminal of the third differential amplifier 122 and the output terminal of the fourth differential amplifier 123, and the input terminal of the second common mode feedback circuit 124 is configured for inputting common mode level. The output terminal of the second common mode feedback circuit 124 serves as the input terminal of the common mode circuit of the third differential amplifier 122 and the fourth differential amplifier 123, to stabilize the output stage common mode levels of the third differential amplifier 122 and the fourth differential amplifier 123. The second common mode feedback circuit 124 is also configured for stably outputting a common mode voltage when the signals input from the second signal input terminal 121 is switched between a small signal less than the preset threshold and a large signal that exceeds the preset threshold.

Further, the first common mode feedback circuit 104 includes a first common mode operational amplifier 1040, a first common mode feedback resistor 1041, and a second common mode feedback resistor 1042. The output terminal of the first common mode operational amplifier 1040 serves as the input terminals of the common mode circuit of the first differential amplifier 102 and the second differential amplifier 103. The two ends of the first common mode feedback resistor 1041 are respectively connected to the output terminal of the second differential amplifier 103 and the second input terminal of the first common mode operational amplifier 1040. One end of the second common mode feedback resistor 1042 is connected to the second input terminal of the first common mode operational amplifier 1040, and the other end of the second common mode feedback resistor 1042 is grounded. The first common mode feedback circuit 104 is also configured for stably outputting a common mode voltage when the signals input from the first signal input terminal 101 is switched between a small signal less than the preset threshold and a large signal that exceeds the preset threshold.

The second common mode feedback circuit 124 includes a second common mode operation amplifier 1240, a third common mode feedback resistor 1241, and a fourth common mode feedback resistor 1242. The output terminal of the second common mode operational amplifier 1240 is used as the input terminal of the common mode circuit of the third differential amplifier 122 and the fourth differential amplifier 123. The two ends of the third common mode feedback resistor 1241 are respectively connected to the output terminal of the third differential amplifier 122 and the second input terminal of the second common mode operational amplifier 1240. One end of the fourth common mode feedback resistor 1242 is connected to the second input terminal of the second common mode operational amplifier 1240, and the other end of the fourth common mode feedback resistor 1242 is grounded.

It is understand that when the gating circuit 111 is closed, one end of the first bridge type amplifying circuit 10 and one end of the second bridge type amplifying circuit 12 are connected with each other through the gating circuit 111, and the first bridge type amplifying circuit 10 and the second bridge type amplifying circuit 12 achieve stability at the common mode level by the first common mode feedback circuit 104 and the second common mode feedback circuit 124.

In one embodiment, the power amplifier further includes a common mode level input circuit 16, the common mode level input circuit 16 is connected to the first input terminal of the first common mode operational amplifier 1040 and the first input terminal of the second common mode operational amplifier 1240, respectively. It can be understood that the first input terminal of the first common mode operational amplifier 1040 and the first input terminal of the second common mode operational amplifier 1240 are input with a constant common mode level through the common mode level input circuit 16. The second input terminal of the first common mode operational amplifier 1040 obtains the common mode level by the first common mode feedback resistor 1041 and the second common mode feedback resistor 1042, and the second input terminal of the second common mode operational amplifier 1240 obtains the common mode level by the third common mode feedback resistor 1241 and the fourth common mode feedback resistor 1242.

Specifically, the common mode level input circuit 16 includes a constant power supply 160, a first resistor 161, and a second resistor 162 that are electrically connected in series. The end of the second resistor 162 away from the first resistor 161 is grounded, and the end of the second resistor 162 close to the first resistor 161 is respectively connected to the first input terminal of the first common mode operational amplifier 1040 and the first input terminal of the second common mode operational amplifier 1240. The constant common mode level is input to the first input terminal of the first common mode operational amplifier 1040 and the first input terminal of the second common mode operational amplifier 1240 through the cooperation of the constant power supply 160, the first resistor 161, and the second resistor 162. When the supply voltage of the constant power supply 160 is VCC, the resistance of the first resistor DE is R1, and the resistance of the second resistor is R2, the constant common mode level is VCC*R2/(R1+R2).

Figure 6:
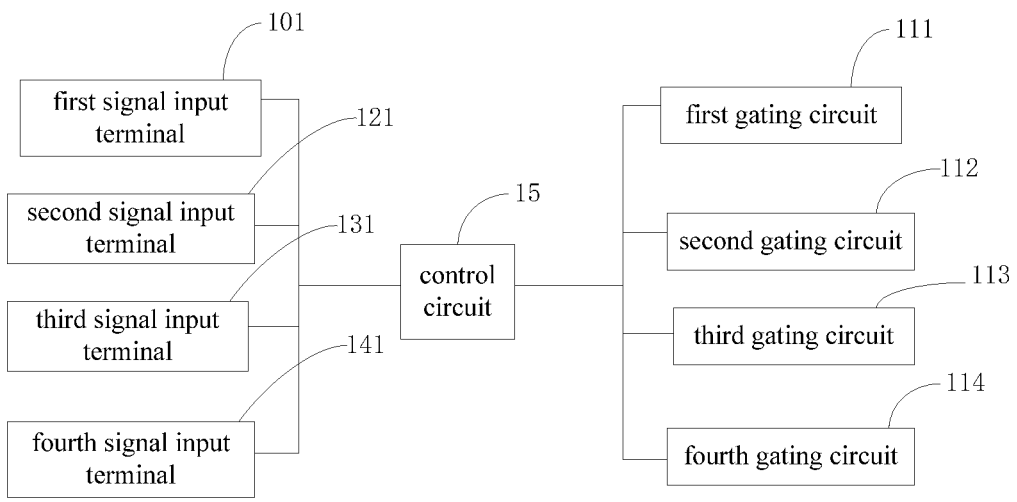
FIG. 6 is a schematic view of an embodiment of a control circuit.

It can be understood that the power amplifier also includes a control circuit 15 as shown in FIG. 6, the control circuit 15 is coupled to the gating circuit 111. The control circuit 15 is configured to control the gating circuit 111 to be turn off or turn on according to the input signal input from the first signal input terminal 101 and the second signal input terminal 121.

In one embodiment, the power amplifier is an audio amplifier, and the first load 100 of the first bridge type amplifying circuit 10 and the second load 120 of the second bridge type amplifying circuit 12 are both speakers. It is understood that class AB power amplifiers are widely used in the audio field due to the compromise of sound quality and efficiency. In order to improve the sound quality of the class AB power amplifier to be a level close to that of the class A power amplifier when inputting the small signal audio, the output transistor will be in a slightly conducting state when there is no signal. In order to work in a wider power range as close to the class A power amplifier, the bias current will be adjusted to a very high place, which will cause the efficiency of the power amplifier to drop sharply and generate a lot of heat, and the chip is in a high temperature state for a long time, resulting in a sharp decline in chip reliability. In order to solve these problems, the present application introduces the high efficiency mode (HE mode) into the design of the class AB power amplifier. According to the characteristics of the audio signal, the first bridge type amplifying circuit 10 and the second bridge type amplifying circuit 12 are connected through the gating circuit 111 when the input is a small audio signal. Thus, the current can be shared between the first bridge type amplifying circuit 10 and the second bridge type amplifying circuit 12 through the gating circuit 111, so as to improve the efficiency of the bridge type amplifying circuit.

Since there are two first bridge type amplifying circuits 10 and two second bridge type amplifying circuits 12 in FIG. 1, the output terminal of the second differential amplifier 103 of each first bridge type amplifying circuit 10 is connected to the output terminals of the third differential amplifier 122 of each second bridge type amplifying circuit 12 through a gate circuit 111. For ease of understanding, the two first bridge type amplifying circuits 10 in FIG. 1 are respectively labeled as the first bridge type amplifying circuit 10 and the fourth bridge type amplifying circuit 14, and the two second bridge type amplifying circuits 12 are respectively labeled as the second bridge type amplifying circuit 12 and the third bridge type amplifying circuit 13. The negative pole of the first load 100 of the first bridge type amplifying circuit 10 is coupled to the positive pole of the second load 120 of the second bridge type amplifying circuit 12 through the first gate circuit 111. The negative pole of the first load 100 of the first bridge type amplifying circuit 10 is coupled to the positive pole of the third load 130 of the third bridge type amplifying circuit 13 through the second gating circuit 112.

The third bridge type amplifying circuit 13 includes a fifth differential amplifier 132, a sixth differential amplifier 133, and a third common mode feedback circuit 134. The positive input terminal of the fifth differential amplifier 132 and the positive input terminal of the sixth differential amplifier 133 are respectively connected to the third signal input terminal 131. A third load 130 is connected between the output terminal of the fifth differential amplifier 132 and the output terminal of the sixth differential amplifier 133, and the input terminal of the third common mode feedback circuit 134 is configured to input common mode level. The output terminal of the third common mode feedback circuit 134 is used as the input terminal of the common mode circuit of the fifth differential amplifier 132 and the sixth differential amplifier 133, to stabilize the output stage common mode level of the fifth differential amplifier 132 and the sixth differential amplifier 133. The negative pole of the fourth load 140 of the fourth bridge type amplifying circuit 14 is coupled to the positive pole of the third load 130 of the third bridge type amplifying circuit 13 through the third gating circuit 113, and the negative pole of the fourth load 140 of the fourth bridge type amplifying circuit 14 is coupled to the positive pole of the second load 120 of the second bridge type amplifying circuit 12 through the fourth gating circuit 114. As shown in FIG. 1, the negative pole of the first load 100 of the first bridge type amplifying circuit 10 is not coupled to the positive pole of the fourth load 140 of the fourth bridge type amplifying circuit 14. The positive pole of the second load 120 of each second bridge type amplifying circuit 12 is not coupled to the negative of the third load 130 of the third bridge type amplifying circuit 13.

The fourth bridge type amplifying circuit 14 includes a seventh differential amplifier 142, an eighth differential amplifier 143, and a fourth common mode feedback circuit 144. The positive input terminal of the seventh differential amplifier 142 and the positive input terminal of the eighth differential amplifier 143 are respectively connected to the fourth signal input terminal 141. A fourth load 140 is connected between the output terminal of the seventh differential amplifier 142 and the output terminal of the eighth differential amplifier 143, and the input terminal of the fourth common mode feedback circuit 144 is configured to input the common mode level. The output terminal of the fourth common mode feedback circuit 144 serves as the input terminal of the common mode circuit of the seventh differential amplifier 142 and the eight differential amplifier 143, to stabilize the output stage common mode level of the seventh differential amplifier 142 and the eighth differential amplifier 143.

Specifically, the third common mode feedback circuit 134 includes a third common mode operational amplifier 1340, a fifth common mode feedback resistor 1341, and a sixth common mode feedback resistor 1342. The output terminal of the third common mode operational amplifier 1340 serves as the input terminal of the common mode circuit of the fifth differential amplifier 132 and the sixth differential amplifier 133, the two ends of the fifth common mode feedback resistor 1341 are respectively connected to the output terminal of the fifth differential amplifier 132 and the second input terminal of the third common mode operational amplifier 1340. One end of the sixth common mode feedback resistor 1342 is connected to the second input terminal of the third common mode operational amplifier 1340, and the other end of the sixth common mode feedback resistor 1342 is grounded.

The fourth common mode feedback circuit 144 includes a fourth common mode operational amplifier 1440, a seventh common mode feedback resistor 1441, and an eighth common mode feedback resistor 1442. The output terminal of the fourth common mode operational amplifier 1440 serves as the input terminal of the common mode circuit of the seventh differential amplifier 142 and the eight differential amplifier 143. The two ends of the seventh common mode feedback resistor 1441 are respectively connected to the output terminal of the eighth differential amplifier 143 and the second input terminal of the fourth common mode operational amplifier 1440. One end of the eighth common mode feedback resistor 1442 is connected to the second input terminal of the fourth common mode operational amplifier 1440, and the other end of the eighth common mode feedback resistor 1442 is grounded. One end of the second resistor 162 in the common mode level input circuit 16 that is close to the first resistor 161 is respectively connected to the first input terminal of the first common mode operational amplifier 1040, the first input terminal of the second common mode operational amplifier 1240, the first input terminal of the third common mode operational amplifier 1340, and the first input terminal of the fourth common mode operational amplifier 1440.

As shown in FIG. 6, the control circuit 15 can be coupled to each of the first gating circuit 111, the second gating circuit 112, the third gating circuit 113 and the fourth gating circuit 114. The control circuit 15 can be coupled to each of the first signal input terminal 101, the second signal input terminal 121, the third signal input terminal 131, and the fourth signal input terminal 141, and configured to obtain input signal input from the first signal input terminal 101, the second signal input terminal 121, the third signal input terminal 131, and the fourth signal input terminal 141. The control circuit 15 is configured to control each of the first gating circuit 111, the second gating circuit 112, the third gating circuit 113 and the fourth gating circuit 114 to be turn off or turn on according to the input signal input from the first signal input terminal 101, the second signal input terminal 121, the third signal input terminal 131, and the fourth signal input terminal 141.

In one embodiment, the control circuit 15 is coupled to the gating circuit, and the control circuit is configured to control the gating circuit to be turn off or turn on according to the first input signal input from the first signal input terminal of each of the at least two first bridge type amplifying circuits and the second input signal input from the second signal input terminal of each of the at least two second bridge type amplifying circuits, so that each of the at least two first bridge type amplifying circuits and each of the at least two second bridge type amplifying circuits are in conducting state or non-conducting state input signals input from the first signal input terminal and the second signal input terminal.

In one embodiment, the control circuit 15 is configured to select one of the at least two first bridge type amplifying circuits with the first input signal less than the preset threshold and one of the at least two second bridge type amplifying circuits with the second input signal less than the preset threshold, and control corresponding gating circuit to be turned on, so that the one of the at least two first bridge type amplifying circuits with the first input signal less than the preset threshold and the one of the at least two second bridge type amplifying circuits with the second input signal less than the preset threshold share load current by the corresponding gating circuit.

In one embodiment, the control circuit 15 is configured to select all of the at least two first bridge type amplifying circuits with the first input signal less than the preset threshold and all of the at least two second bridge type amplifying circuits with the second input signal less than the preset threshold, and control corresponding gating circuit to be turned on, so that each first bridge type amplifying circuit with the first input signal less than the preset threshold and each second bridge type amplifying circuit with the second input signal less than the preset threshold share load current by the corresponding gating circuit.

In one embodiment, the control circuit 15 is configured to select one of the at least two first bridge type amplifying circuits with the first input signal greater than the preset threshold, and control corresponding gating circuit to be turned off, so that the one of the at least two first bridge type amplifying circuits with the first input signal greater than the preset threshold does not share load current with any one of the at least two second bridge type amplifying circuits; and select one of the at least two second bridge type amplifying circuits with the second input signal greater than the preset threshold, and control corresponding gating circuit to be turned off, so that the one of the at least two second bridge type amplifying circuits with the second input signal greater than the preset threshold does not share load current with any one of the at least two first bridge type amplifying circuits.

In one embodiment, the control circuit 15 is configured to select all of the at least two first bridge type amplifying circuits with the first input signal greater than the preset threshold, and control corresponding gating circuit to be turned off, so that each first bridge type amplifying circuit with the first input signal greater than the preset threshold does not share load current with any one of the at least two second bridge type amplifying circuits; and select all of the at least two second bridge type amplifying circuits with the second input signal greater than the preset threshold, and control corresponding gating circuit to be turned off, so that each second bridge type amplifying circuit with the second input signal greater than the preset threshold does not share load current with any one of the at least two first bridge type amplifying circuits.

It can be understood that, in the power amplifier in this embodiment, any two channels of one first bridge type amplifying circuit 10 and one second bridge type amplifying circuit 12 can be controlled to achieve high-efficiency modes through one of the first gating circuit 111, the second gating circuit 112, the third gating circuit 113, and the fourth gating circuit 114. Therefore, when the input signal input at different signal input terminal is in different size and phase, the current in each of the channels of the at least two first bridge type amplifying circuits 10 can be shared by each of other channels the at least two second bridge type amplifying circuit 12 to save current, so as to improve the efficiency of each bridge type amplifying circuit, thereby significantly saving the power consumption of the power amplifier and improving the efficiency of the class AB power amplifier.

In one embodiment, there is only one first bridge type amplifying circuit with the input signal less than the preset threshold and only one second bridge type amplifying circuit with the input signal less than the preset threshold. Only one gating circuit is turn on, so that the only one first bridge type amplifying circuit with the input signal less than the preset threshold and the only one second bridge type amplifying circuit with the input signal less than the preset threshold can share load current.

In one embodiment, there are only one first bridge type amplifying circuit with the input signal less than the preset threshold, and two or more than two second bridge type amplifying circuits with the input signal less than the preset threshold. Two or more than two gating circuits are turn on, so that each second bridge type amplifying circuit with the input signal less than the preset threshold can share load current with the only one first bridge type amplifying circuit with the input signal less than the preset threshold.

In one embodiment, there are two or more than two first bridge type amplifying circuits with the input signal less than the preset threshold, and only one second bridge type amplifying circuit with the input signal less than the preset threshold. Two or more than two gating circuits are turn on, so that each first bridge type amplifying circuit with the input signal less than the preset threshold can share load current with the only one second bridge type amplifying circuit with the input signal less than the preset threshold.

In one embodiment, all of the first bridge type amplifying circuits have the input signal less than the preset threshold, and all of the second bridge type amplifying circuits have the input signal less than the preset threshold. All the gating circuits are turn on, so that each first bridge type amplifying circuit with the input signal less than the preset threshold can share load current with each second bridge type amplifying circuit with the input signal less than the preset threshold.

In one embodiment, one first bridge type amplifying circuit has the input signal greater than the preset threshold. All the gating circuits connected to the one first bridge type amplifying circuit with the input signal greater than the preset threshold are turn off, so that the one first bridge type amplifying circuit with the input signal greater than the preset threshold cannot share load current with any one second bridge type amplifying circuit.

In one embodiment, one second bridge type amplifying circuit has the input signal greater than the preset threshold. All the gating circuits connected to the one second bridge type amplifying circuit with the input signal greater than the preset threshold are turn off, so that the one second bridge type amplifying circuit with the input signal greater than the preset threshold cannot share load current with any one first bridge type amplifying circuit.

In one embodiment, all of the first bridge type amplifying circuits have the input signal greater than the preset threshold, and/or all of the second bridge type amplifying circuits have the input signal greater than the preset threshold. All the gating circuits are turn off, so that each first bridge type amplifying circuit with the input signal greater than the preset threshold cannot share load current with any one second bridge type amplifying circuit with the input signal greater than the preset threshold.

Figure 7:
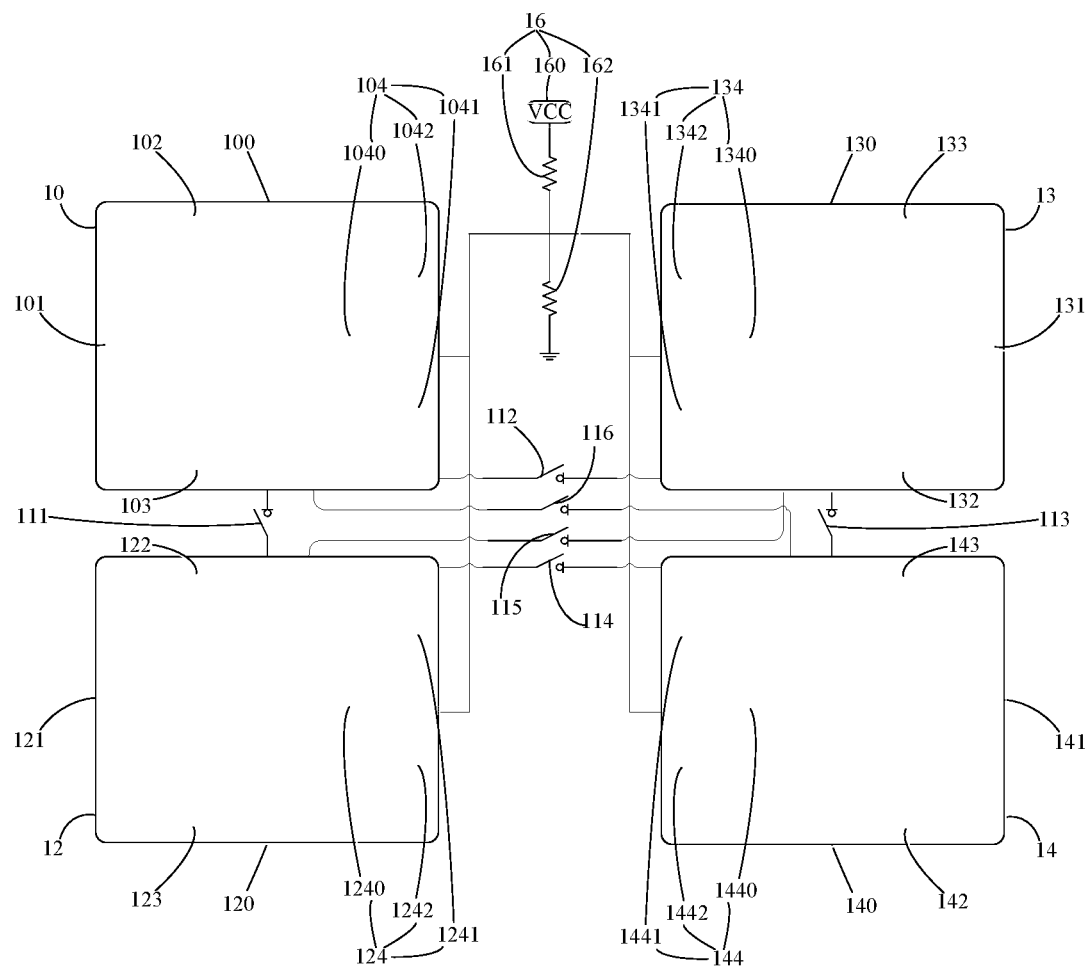
FIG. 7 is a schematic view of another embodiment of a power amplifier.

As shown in FIG. 7, alternatively, the negative pole of the first load 100 of the first bridge type amplifying circuit 10 can also be coupled to the positive pole of the fourth load 140 of the fourth bridge type amplifying circuit 14 through the sixth gating circuit 116. The positive pole of the second load 120 of the second bridge type amplifying circuit 12 can also be coupled to the negative pole of the third load 130 of the third bridge type amplifying circuit 13 through the fifth gating circuit 115. Thus, each two of the at least four bridge type amplifying circuits are coupled to each other through a gating circuit, and the gating circuit is respectively coupled to a negative pole of a first load of one of the each two of the at least four bridge type amplifying circuits and a second load of the other one of the each two of the at least four bridge type amplifying circuits; in response to that both input signals input from the signal input terminals of the each two of the at least four bridge type amplifying circuits are less than a preset threshold, the gating circuit is turned on, so that the each two of the at least four bridge type amplifying circuits can share load current by the gating circuit.

Figure 2:
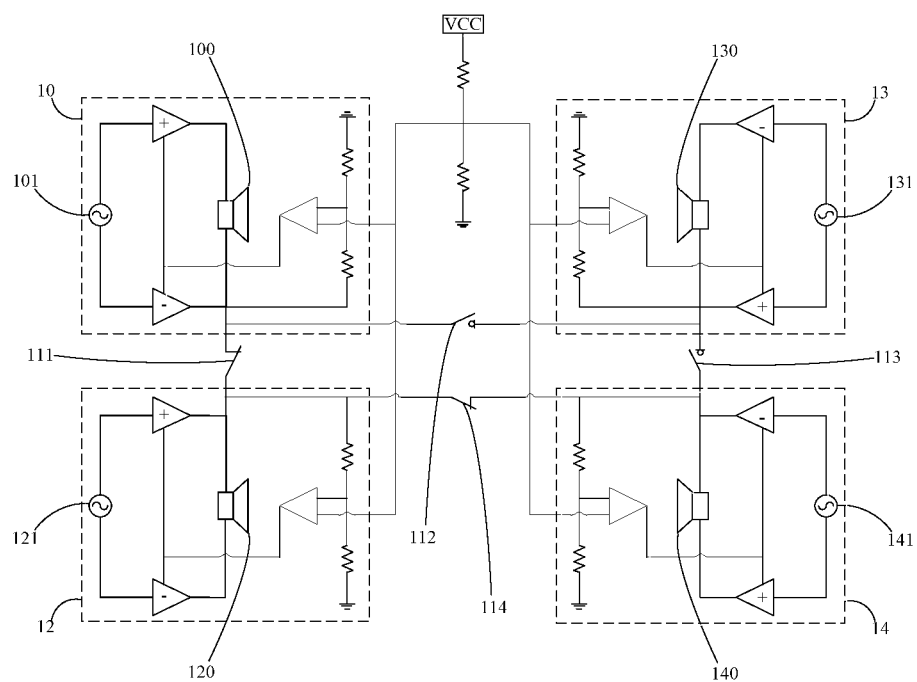
FIG. 2 is a schematic view of the power amplifier in an application scenario.

Referring to FIG. 2, which is a schematic view of the power amplifier in an application scenario. In the application scenario, the input signal input from the first signal input terminal 101 of the first bridge type amplifying circuit 10, the second signal input terminal 121 of the second bridge type amplifying circuit 12, and the fourth signal input terminal 141 of the fourth bridge type amplifying circuit 14 are all small signals less than the preset threshold; and the input signal input from the third signal input terminal 131 of the third bridge type amplifying circuit 13 is a large signal that exceeds the preset threshold. Since the class AB power amplifier can make the output transistor in the on state when the signal is small, there is a waste of standby power and a loss of power efficiency. Therefore, the first gating circuit 111 and the fourth gating circuit 114 can be closed, so that the first bridge type amplifying circuit 10, the second bridge type amplifying circuit 12, and the fourth bridge type amplifying circuit 14 can share current. Thus the actual power consumption of the first bridge type amplifying circuit 10, the second bridge type amplifying circuit 12, and the fourth bridge type amplifying circuit 14 to achieve the required output power is less than that of the class AB power amplifier in prior art. That is, the efficiency of the first bridge type amplifying circuit 10, the second bridge type amplifying circuit 12, and the fourth bridge type amplifying circuit 14 can be improved. At the same time, since the input signal input from the third signal input terminal 131 is a large signal exceeding the preset threshold, the third bridge type amplifying circuit 13 can achieve the required output power through the standard bridge mode. Therefore, it is necessary to turn off the second gating circuit 112 and the third gating circuit 113 to make the third bridge type amplifying circuit 13 from other bridge type amplifying circuits in non-conducting state.

The present application also provides a vehicle audio system including the power amplifier as described above. In another application scenario, the power amplifier shown in FIG. 1 is an audio amplifier in the vehicle audio system; and the first load 100, the second load 120, the third load 130, and the fourth load 140 are respectively the left front speaker, the left rear speaker, the right front speaker, and the right rear speaker. As the current sound system improves, the audio source input usually performs signal processing to achieve a stereo effect, which causes the audio signal of each signal input terminal to be not only inconsistent in size, but also inconsistent in phase. When the power amplifier of the present application inputs small signals at the first signal input terminal 101, the second signal input terminal 121, the third signal input terminal 131, and the fourth signal input terminal 141, the first gating circuit 111, the second gating circuit 112, the third gating circuit 113, and the fourth gating circuit 114 are turned on, so that the 4-bridge high-efficiency mode can be realized. Specifically, when the signals input from the first signal input terminal 101, the second signal input terminal 121, the third signal input terminal 131, and the fourth signal input terminal 141 are all less than the preset threshold, each of the four channels has one end are connected together by the first gating circuit 111, the second gating circuit 112, the third gating circuit 113, and the fourth gating circuit 114 and stabilized at the common mode value, while the other four terminals will output large signals to realize the load speaker playback. In addition, when the input signal exceeds the preset threshold, the input terminal of each common mode feedback circuit will be switched at the same time to ensure that the output common mode level is normal. Therefore, the power amplifier can control the conducting state or non-conducting state between different channels through each gating circuit, so as to realize the high-efficiency mode selection between any channels, so that not only can the power consumption be reduced when the signals input from the signal input terminals are the same, but also large power consumption savings can also be achieved when the signals input at each signal input terminal are inconsistent.

Figure 3:
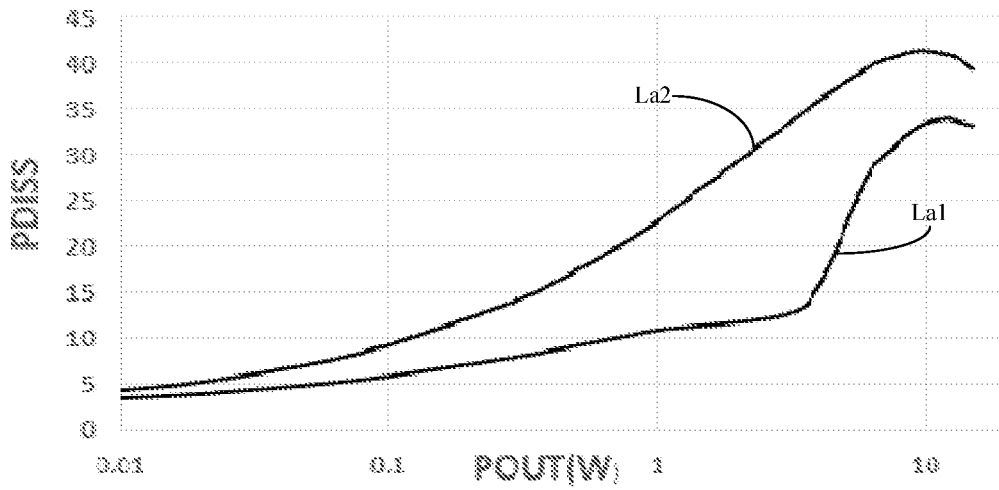
FIG. 3 is schematic diagrams of simulation curves of power consumption of the power amplifier of FIG. 1 and the class AB power amplifier in prior art.
Figure 4:
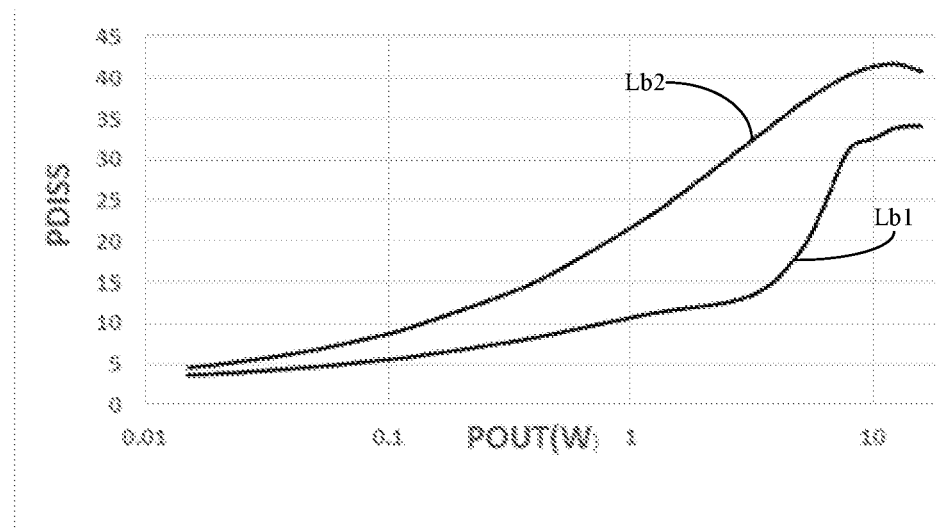
FIG. 4 is schematic diagrams of simulation curves of power consumption of the power amplifier of FIG. 1 and the traditional class AB power amplifier in prior art.

Referring to FIGS. 3 and 4, FIGS. 3 and 4 are schematic diagrams of power consumption simulation curves of the power amplifier of FIG. 1 and the class AB power amplifier in prior art. The power consumption of the power amplifier in FIG. 1 and the class AB power amplifier in prior art are simulated and verified respectively. FIG. 3 shows a schematic diagram of the curve of the output power (abscissa, Pout) and output stage power consumption (ordinate, Pdiss) when the input signal is of the same size and phase, La1 is the power consumption curve of the power amplifier of the present application, and La2 is the power consumption curve of the class AB power amplifier in prior art. FIG. 4 is a schematic diagram of the curve of the output power (abscissa, Pout) and output stage power consumption (ordinate, Pdiss) when the input signal is the same size and the phase difference is 90°, Lb1 is the power consumption curve of the power amplifier of the present application, and Lb2 is the power consumption curve of the class AB power amplifier in prior art. According to the simulation results, it can be found that whether the input signal is the same size and the same phase, or the input signal is the same size and different phase, when outputting the same power, the power consumption of the power amplifier of the present application is much lower than that of the traditional class AB power amplifier in prior art.

Figure 5:
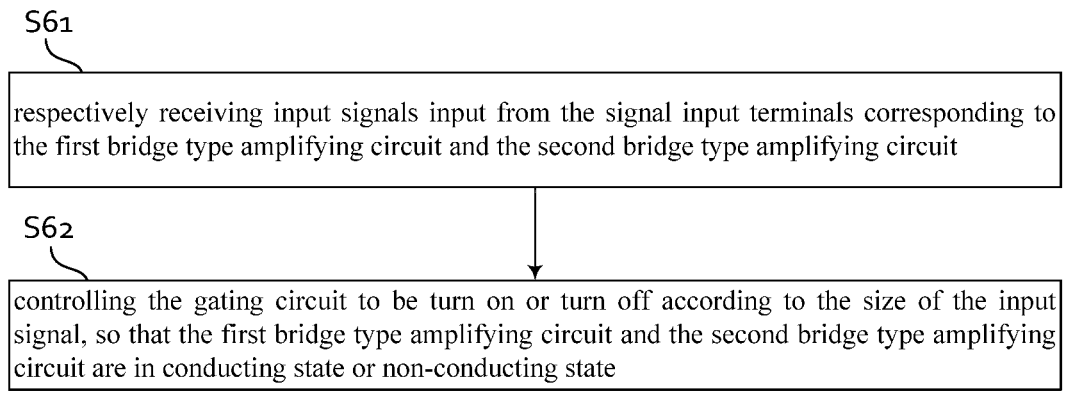
FIG. 5 is a flowchart of an embodiment of a control method of the power amplifier.

The present application also provides a control method of the power amplifier. Referring to FIG. 5, which is a flowchart of an embodiment of the control method for the power amplifier. In one embodiment, the control method is applied to any of the above-mentioned power amplifiers and performed by the control circuit 15, and includes the following steps:

S61: respectively receiving input signals input from the signal input terminals corresponding to the first bridge type amplifying circuit 10 and the second bridge type amplifying circuit 12; and S62: controlling the gating circuit to be turn on or turn off according to the size of the input signal, so that the first bridge type amplifying circuit 10 and the second bridge type amplifying circuit 12 are in conducting state or non-conducting state.

Specifically, the above step S62 includes: judging whether the input signal is greater than the preset threshold; if so, controlling the gating circuit to be turn off, so that the first bridge type amplifying circuit and the second bridge type amplifying circuit are in non-conducting state; if not, controlling the gating circuit to be turn on, so that the gating circuit transmits the load current of the first bridge type amplifying circuit 10 to the load of the second bridge type amplifying circuit 12.

In one embodiment, by respectively receiving the input signals input from the signal input terminals corresponding to the first bridge type amplifying circuit 10 and the second bridge type amplifying circuit 12, the gating circuit is controlled to be turn off when the input signal is greater than the preset threshold. At this time, the first bridge type amplifying circuit 10 and the second bridge type amplifying circuit 12 will enter the standard bridge mode to achieve the required output power. When the input signal is a small signal smaller than the preset threshold, the gating circuit is controlled to be turn on, the load current of the first bridge type amplifying circuit 10 is transmitted to the load of the second bridge type amplifying circuit 12, so that the power amplifier can save greater power consumption and the efficiency of the class AB power amplifier can be improved.

In the several embodiments provided in present application, it should be understood that the disclosed method and power amplifier can be implemented in other ways. For example, the implementation of the power amplifier described above is only illustrative. For example, the division of modules or units is only a logical function division. In actual implementation, there may be other division methods, for example, multiple units or components can be combined or integrated into another system, or some features can be ignored or not implemented. In addition, the displayed or discussed mutual coupling, direct coupling, or communication connection may be indirect coupling or communication connection through some interfaces, devices or units; and may be in electrical, mechanical or other forms.

The units described as separate components may or may not be physically separate, and the components displayed as units may or may not be physical units. That is, the units may be located in one place, or distributed on multiple network units. Some or all of the units may be selected according to actual needs to achieve the objectives of the solutions of present embodiment.

In addition, the functional units in the various embodiments of the present application may be integrated into one processing unit, or each unit may exist alone physically, or two or more units may be integrated into one unit. The above-mentioned integrated unit can be implemented in the form of hardware or software functional unit.

If the integrated unit is realized in the form of a software functional unit and sold (or used) as an independent product, it can be stored in a computer readable storage medium. Based on this understanding, the technical solution of present application essentially, the part that contributes to the traditional technology, or all or part of the technical solution, can be embodied in the form of a software product. The computer software product is stored in a storage medium, and includes several instructions to make a computer device (which can be a personal computer, a server, or a network device, etc.) or a processor execute all or part of the steps of the methods in the various embodiments of the present application. The aforementioned storage media include: U disk, mobile hard disk, read-only memory (ROM), random access memory (RAM), magnetic disks or optical disks and other media that can store program codes.

It is to be understood that the above-described exemplary embodiments are intended to illustrate rather than limit the disclosure. Any elements described in accordance with any exemplary embodiments is understood that they can be used in addition or substituted in other exemplary embodiments. Exemplary embodiments can also be used together. Variations can be made to the exemplary embodiments without departing from the spirit of the disclosure. The above-described exemplary embodiments illustrate the scope of the disclosure but do not restrict the scope of the disclosure.

Depending on the exemplary embodiment, certain of the actions of methods described can be removed, others can be added, and the sequence of actions can be altered. It is also to be understood that the description and the claims drawn to a method may include some indication in reference to certain actions. However, the indication used is only to be viewed for identification purposes and not as a suggestion as to an order for the actions.

What is claimed is:

1. A power amplifier, comprising:
   at least two first bridge type amplifying circuits, wherein each of the at least two first bridge type amplifying circuits comprises a first signal input terminal; and
   at least two second bridge type amplifying circuits, wherein each of the at least two second bridge type amplifying circuits comprises a second signal input terminal;
   wherein a negative pole of a first load of each of the at least two first bridge type amplifying circuits is respectively coupled to a positive pole of a second load of each of the at least two second bridge type amplifying circuits through a gating circuit; in response to that both a first input signal input from the first signal input terminal of one of the at least two first bridge type amplifying circuits and a second input signal input from the second signal input terminal of one of the at least two second bridge type amplifying circuits are less than a preset threshold, the gating circuit is turned on, so that the one of the at least two first bridge type amplifying circuits and the one of the at least two second bridge type amplifying circuits can share load current by the gating circuit.

2. The power amplifier of claim 1, wherein each of the at least two first bridge type amplifying circuits comprises a first differential amplifier, a second differential amplifier, and a first common mode feedback circuit; a positive input terminal of the first differential amplifier and a positive input terminal of the second differential amplifier are respectively connected to the first signal input terminal, and both an output terminal of the first differential amplifier and an output terminal of the second differential amplifier are connected to the first load; and a negative input terminal of the first differential amplifier and a negative input terminal of the second differential amplifier are respectively connected to an output terminal of the first common mode feedback circuit, and an input terminal of the first common mode feedback circuit is configured for inputting a first common mode level; and
   each of the at least two second bridge type amplifying circuit comprises a third differential amplifier, a fourth differential amplifier, and a second common mode feedback circuit; a positive input terminal of the third differential amplifier and a positive input terminal of the fourth differential amplifier are respectively connected to a second signal input terminal, and both an output terminal of the third differential amplifier and an output terminal of the fourth differential amplifier are connected to the second load; and a negative input terminal of the third differential amplifier and a negative input terminal of the fourth differential amplifier are respectively connected to an output terminal of the second common mode feedback circuit, and an input terminal of the second common mode feedback circuit is configured for inputting a second common mode level.

3. The power amplifier of claim 2, wherein the first common mode feedback circuit comprises a first common mode operational amplifier, a first common mode feedback resistor, and a second common mode feedback resistor; the negative input terminal of the first differential amplifier and the negative input terminal of the second differential amplifier are respectively connected to an output terminal of the first common mode operational amplifier; one end of the first common mode feedback resistor is connected to the output terminal of the second differential amplifier, and the other end of the first common mode feedback resistor is connected to a second input terminal of the first common mode operational amplifier; and one end of the second common mode feedback resistor is connected to the second input terminal of the first common mode operational amplifier, and the other end of the second common mode feedback resistor is grounded; and
   the second common mode feedback circuit comprises a second common mode operation amplifier, a third common mode feedback resistor, and a fourth common mode feedback resistor; the negative input terminal of the third differential amplifier and the negative input terminal of the fourth differential amplifier are respectively connected to an output terminal of the second common mode operational amplifier; one end of the third common mode feedback resistor is connected to the output terminal of the third differential amplifier, and the other end of the third common mode feedback resistor is connected to a second input terminal of the second common mode operational amplifier; and one end of the fourth common mode feedback resistor is connected to the second input terminal of the second common mode operational amplifier, and the other end of the fourth common mode feedback resistor is grounded.

4. The power amplifier of claim 3, wherein the power amplifier further comprises a common mode level input circuit, and the common mode level input circuit is respectively connected to a first input terminal of the first common mode operational amplifier and a first input terminal of the second common mode operational amplifier.

5. The power amplifier of claim 4, wherein the common mode level input circuit comprises a constant power supply, a first resistor, and a second resistor that are electrically connected in series; and an end of the second resistor away from the first resistor is grounded, and an end of the second resistor close to the first resistor is respectively connected to the first input terminal of the first common mode operational amplifier and the first input terminal of the second common mode operational amplifier.

6. The power amplifier of claim 1, further comprising a control circuit, wherein the control circuit is coupled to the gating circuit, and the control circuit is configured to control the gating circuit to be turn off or turn on according to the first input signal input from the first signal input terminal of each of the at least two first bridge type amplifying circuits and the second input signal input from the second signal input terminal of each of the at least two second bridge type amplifying circuits, so that each of the at least two first bridge type amplifying circuits and each of the at least two second bridge type amplifying circuits are in conducting state or non-conducting state.

7. The power amplifier of claim 6, wherein the control circuit is configured to:
   select one of the at least two first bridge type amplifying circuits with the first input signal less than the preset threshold and one of the at least two second bridge type amplifying circuits with the second input signal less than the preset threshold, and control corresponding gating circuit to be turned on, so that the one of the at least two first bridge type amplifying circuits with the first input signal less than the preset threshold and the one of the at least two second bridge type amplifying circuits with the second input signal less than the preset threshold share load current by the corresponding gating circuit.

8. The power amplifier of claim 6, wherein the control circuit is configured to:
    select all of the at least two first bridge type amplifying circuits with the first input signal less than the preset threshold and all of the at least two second bridge type amplifying circuits with the second input signal less than the preset threshold, and control corresponding gating circuit to be turned on, so that each first bridge type amplifying circuit with the first input signal less than the preset threshold and each second bridge type amplifying circuit with the second input signal less than the preset threshold share load current by the corresponding gating circuit.

9. The power amplifier of claim 6, wherein the control circuit is configured to:
    select one of the at least two first bridge type amplifying circuits with the first input signal greater than the preset threshold, and control corresponding gating circuit to be turned off, so that the one of the at least two first bridge type amplifying circuits with the first input signal greater than the preset threshold does not share load current with any one of the at least two second bridge type amplifying circuits; and
    select one of the at least two second bridge type amplifying circuits with the second input signal greater than the preset threshold, and control corresponding gating circuit to be turned off, so that the one of the at least two second bridge type amplifying circuits with the second input signal greater than the preset threshold does not share load current with any one of the at least two first bridge type amplifying circuits.

10. The power amplifier of claim 6, wherein the control circuit is configured to:
    select all of the at least two first bridge type amplifying circuits with the first input signal greater than the preset threshold, and control corresponding gating circuit to be turned off, so that each first bridge type amplifying circuit with the first input signal greater than the preset threshold does not share load current with any one of the at least two second bridge type amplifying circuits; and
    select all of the at least two second bridge type amplifying circuits with the second input signal greater than the preset threshold, and control corresponding gating circuit to be turned off, so that each second bridge type amplifying circuit with the second input signal greater than the preset threshold does not share load current with any one of the at least two first bridge type amplifying circuits.

11. The power amplifier of claim 1, wherein the power amplifier is an audio amplifier, and the first load is a first speaker and the second load is a second speaker.

12. A vehicle audio system, comprising:
    a power amplifier comprising:
        at least two first bridge type amplifying circuits, wherein each of the at least two first bridge type amplifying circuits comprises a first signal input terminal and a first speaker; and
        at least two second bridge type amplifying circuits, wherein each of the at least two second bridge type amplifying circuits comprises a second signal input terminal and a second speaker;
        wherein a negative pole of a first speaker of each of the at least two first bridge type amplifying circuits is respectively coupled to a positive pole of a second speaker of each of the at least two second bridge type amplifying circuits through a gating circuit; in response to that both a first input signal input from the first signal input terminal of one of the at least two first bridge type amplifying circuits and a second input signal input from the second signal input terminal of one of the at least two second bridge type amplifying circuits are less than a preset threshold, the gating circuit is turned on, so that the one of the at least two first bridge type amplifying circuits and the one of the at least two second bridge type amplifying circuits can share load current by the gating circuit.

13. The vehicle audio system of claim 12, wherein each of the at least two first bridge type amplifying circuits comprises a first differential amplifier, a second differential amplifier, and a first common mode feedback circuit; a positive input terminal of the first differential amplifier and a positive input terminal of the second differential amplifier are respectively connected to the first signal input terminal, and both an output terminal of the first differential amplifier and an output terminal of the second differential amplifier are connected to the first speaker; and a negative input terminal of the first differential amplifier and a negative input terminal of the second differential amplifier are respectively connected to an output terminal of the first common mode feedback circuit, and an input terminal of the first common mode feedback circuit is configured for inputting a first common mode level; and
    each of the at least two second bridge type amplifying circuit comprises a third differential amplifier, a fourth differential amplifier, and a second common mode feedback circuit; a positive input terminal of the third differential amplifier and a positive input terminal of the fourth differential amplifier are respectively connected to a second signal input terminal, and both an output terminal of the third differential amplifier and an output terminal of the fourth differential amplifier are connected to the second speaker; and a negative input terminal of the third differential amplifier and a negative input terminal of the fourth differential amplifier are respectively connected to an output terminal of the second common mode feedback circuit, and an input terminal of the second common mode feedback circuit is configured for inputting a second common mode level.

14. The vehicle audio system of claim 13, wherein the first common mode feedback circuit comprises a first common mode operational amplifier, a first common mode feedback resistor, and a second common mode feedback resistor; the negative input terminal of the first differential amplifier and the negative input terminal of the second differential amplifier are respectively connected to an output terminal of the first common mode operational amplifier; one end of the first common mode feedback resistor is connected to the output terminal of the second differential amplifier, and the other end of the first common mode feedback resistor is connected to a second input terminal of the first common mode operational amplifier; and one end of the second common mode feedback resistor is connected to the second input terminal of the first common mode operational amplifier, and the other end of the second common mode feedback resistor is grounded; and
    the second common mode feedback circuit comprises a second common mode operation amplifier, a third common mode feedback resistor, and a fourth common mode feedback resistor; the negative input terminal of the third differential amplifier and the negative input terminal of the fourth differential amplifier are respectively connected to an output terminal of the second common mode operational amplifier; one end of the third common mode feedback resistor is connected to the output terminal of the third differential amplifier, and the other end of the third common mode feedback resistor is connected to a second input terminal of the second common mode operational amplifier; and one end of the fourth common mode feedback resistor is connected to the second input terminal of the second common mode operational amplifier, and the other end of the fourth common mode feedback resistor is grounded.

15. The vehicle audio system of claim 14, wherein the vehicle audio system further comprises a common mode level input circuit, and the common mode level input circuit is respectively connected to a first input terminal of the first common mode operational amplifier and a first input terminal of the second common mode operational amplifier; the common mode level input circuit comprises a constant power supply, a first resistor, and a second resistor that are electrically connected in series; and an end of the second resistor away from the first resistor is grounded, and an end of the second resistor close to the first resistor is respectively connected to the first input terminal of the first common mode operational amplifier and the first input terminal of the second common mode operational amplifier.

16. The vehicle audio system of claim 12, wherein the power amplifier further comprises a control circuit coupled to the gating circuit, and the control circuit is configured to:
select one of the at least two first bridge type amplifying circuits with the first input signal less than the preset threshold and one of the at least two second bridge type amplifying circuits with the second input signal less than the preset threshold, and control corresponding gating circuit to be turned on, so that the one of the at least two first bridge type amplifying circuits with the first input signal less than the preset threshold and the one of the at least two second bridge type amplifying circuits with the second input signal less than the preset threshold share load current by the corresponding gating circuit.

17. The vehicle audio system of claim 12, wherein the power amplifier further comprises a control circuit coupled to the gating circuit, and the control circuit is configured to:
select all of the at least two first bridge type amplifying circuits with the first input signal less than the preset threshold and all of the at least two second bridge type amplifying circuits with the second input signal less than the preset threshold, and control corresponding gating circuit to be turned on, so that each first bridge type amplifying circuit with the first input signal less than the preset threshold and each second bridge type amplifying circuit with the second input signal less than the preset threshold share load current by the corresponding gating circuit.

18. The vehicle audio system of claim 12, wherein the power amplifier further comprises a control circuit coupled to the gating circuit, and the control circuit is configured to:
select one of the at least two first bridge type amplifying circuits with the first input signal greater than the preset threshold, and control corresponding gating circuit to be turned off, so that the one of the at least two first bridge type amplifying circuits with the first input signal greater than the preset threshold does not share load current with any one of the at least two second bridge type amplifying circuits; and
select one of the at least two second bridge type amplifying circuits with the second input signal greater than the preset threshold, and control corresponding gating circuit to be turned off, so that the one of the at least two second bridge type amplifying circuits with the second input signal greater than the preset threshold does not share load current with any one of the at least two first bridge type amplifying circuits.

19. The vehicle audio system of claim 12, wherein the power amplifier further comprises a control circuit coupled to the gating circuit, and the control circuit is configured to:
select all of the at least two first bridge type amplifying circuits with the first input signal greater than the preset threshold, and control corresponding gating circuit to be turned off, so that each first bridge type amplifying circuit with the first input signal greater than the preset threshold does not share load current with any one of the at least two second bridge type amplifying circuits; and
select all of the at least two second bridge type amplifying circuits with the second input signal greater than the preset threshold, and control corresponding gating circuit to be turned off, so that each second bridge type amplifying circuit with the second input signal greater than the preset threshold does not share load current with any one of the at least two first bridge type amplifying circuits.

20. A power amplifier, comprising:
at least four bridge type amplifying circuits, wherein each of the at least four bridge type amplifying circuits comprises a signal input terminal;
wherein each two of the at least four bridge type amplifying circuits are coupled to each other through a gating circuit, and the gating circuit is respectively coupled to a negative pole of a first load of one of the each two of the at least four bridge type amplifying circuits and a positive pole of a second load of the other one of the each two of the at least four bridge type amplifying circuits; in response to that both input signals input from the signal input terminals of the each two of the at least four bridge type amplifying circuits are less than a preset threshold, the gating circuit is turned on, so that the each two of the at least four bridge type amplifying circuits can share load current by the gating circuit.

* * * * *